(12) United States Patent
Heiman et al.

(10) Patent No.: US 7,706,481 B2
(45) Date of Patent: Apr. 27, 2010

(54) METHOD AND SYSTEM FOR IMPROVING RECEPTION IN WIRED AND WIRELESS RECEIVERS THROUGH REDUNDANCY AND ITERATIVE PROCESSING

(75) Inventors: Arie Heiman, Rannana (IL); Arkady Molev-Shteiman, Bney Barak (IL)

(73) Assignee: Broadcom Corporation, Irvine, CA (US)

( * ) Notice: Subject to any disclaimer, the term of this patent is extended or adjusted under 35 U.S.C. 154(b) by 1007 days.

(21) Appl. No.: 11/189,634

(22) Filed: Jul. 26, 2005

(65) Prior Publication Data
US 2006/0039510 A1 Feb. 23, 2006

Related U.S. Application Data

(60) Provisional application No. 60/603,148, filed on Aug. 20, 2004.

(51) Int. Cl.
*H04L 27/06* (2006.01)

(52) U.S. Cl. .................. 375/341; 375/316; 375/340; 375/342; 375/346; 375/354; 704/206; 704/219; 704/228

(58) Field of Classification Search .......... 375/241, 375/267, 347, 316, 324, 219, 341, 350, 260, 375/340, 342–343, 354, 359, 146, 147, 152, 375/292–295, 306; 704/206, 219, 228
See application file for complete search history.

(56) References Cited

U.S. PATENT DOCUMENTS

| | | | |
|---|---|---|---|
| 5,852,630 A * | 12/1998 | Langberg et al. ............. 375/219 |
| 6,408,267 B1 | 6/2002 | Proust | |
| 6,567,481 B1 | 5/2003 | Molnar | |
| 6,609,008 B1 | 8/2003 | Whang et al. | |
| 7,092,457 B1 * | 8/2006 | Chugg et al. ................. 375/324 |
| 7,099,419 B2 * | 8/2006 | Braun .......................... 375/350 |
| 7,269,209 B2 * | 9/2007 | Peeters ........................ 375/222 |
| 7,593,490 B2 * | 9/2009 | Alagha et al. ............... 375/341 |

(Continued)

FOREIGN PATENT DOCUMENTS

CN 1511388 7/2004

(Continued)

OTHER PUBLICATIONS

Franz V et al; "Iterative Channel Estimation For Turbo-Detection"; ITG Fachberichte, VDE Verlag, Berlin, DE, No. 146, Mar. 1998; pp. 149-154; XP000997637.

(Continued)

*Primary Examiner*—Shuwang Liu
*Assistant Examiner*—Hirdepal Singh
(74) *Attorney, Agent, or Firm*—McAndrews, Held & Malloy

(57) ABSTRACT

A method and system for improving reception in wired and wireless systems through redundancy and iterative processing are provided. A multilayer decoding process may comprise a burst process and a frame process. Results from a first burst process may be utilized to generate a decoded bit sequence in the frame process. The frame process may utilize redundancy information and physical constraints to improve the performance of a decoding algorithm. Results from the frame process may be fed back for a second iteration of the burst process and of the frame process, to further improve the decoding operation. In some instances, the second iteration of the burst process may be based on a gradient search approach.

12 Claims, 16 Drawing Sheets

U.S. PATENT DOCUMENTS

| | | | |
|---|---|---|---|
| 2002/0168017 A1* | 11/2002 | Berthet et al. | 375/267 |
| 2004/0161058 A1 | 8/2004 | Ebiko et al. | |
| 2004/0213360 A1 | 10/2004 | McElwain | |
| 2007/0083362 A1* | 4/2007 | Moriya et al. | 704/219 |
| 2007/0286292 A1* | 12/2007 | Moelker et al. | 375/241 |
| 2008/0112515 A1* | 5/2008 | Kobylinski et al. | 375/341 |

FOREIGN PATENT DOCUMENTS

| | | |
|---|---|---|
| EP | 0782277 B1 | 7/1997 |
| EP | 0897228 B1 | 2/1999 |
| EP | 1065851 B1 | 1/2001 |
| EP | 1189208 B1 | 3/2002 |
| FR | 2809249 B1 | 11/2001 |

OTHER PUBLICATIONS

Zemen T. et al; "Iterative Detection and Channel Estimation for MC-CDMA" ICC 2003; 2003 IEEE International Conference on Communications; Anchorage, AK, May 11-15, 2003, IEEE International Conference of Communications, New York, NY: IEEE, US; vol. vol. 1 of 5; May 11, 2003; pp. 3462-3466; XP010643089.

* cited by examiner

Error in the DCT coefficients

Error in the DCT coefficients

US 7,706,481 B2

METHOD AND SYSTEM FOR IMPROVING RECEPTION IN WIRED AND WIRELESS RECEIVERS THROUGH REDUNDANCY AND ITERATIVE PROCESSING

CROSS-REFERENCE TO RELATED APPLICATIONS/INCORPORATION BY REFERENCE

This patent application makes reference to, claims priority to and claims benefit from U.S. Provisional Patent Application Ser. No. 60/603,148 filed on Aug. 20, 2004.

This application also makes reference to U.S. patent application Ser. No. 11/189,509 filed Jul. 26, 2005.

The above stated applications are hereby incorporated herein by reference in their entirety.

FIELD OF THE INVENTION

Certain embodiments of the invention relate to receivers utilized in wired and wireless communication systems. More specifically, certain embodiments of the invention relate to a method and system for improving reception in wired and wireless receivers through inherent redundancy and iterative processing.

BACKGROUND OF THE INVENTION

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, the optimization of a receiver system may be based on whether the signals being received, generally in the form of successive symbols or information bits, are interdependent. Signals received from, for example, a convolutional encoder, may be interdependent signals, that is, signals with memory. In this regard, a convolutional encoder may generate NRZI or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received.

Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

Improvements in the design and implementation of optimized receivers for decoding convolutional encoded data may require modifications to the application of the MLSE algorithm, the Viterbi algorithm, and/or the MAP algorithm in accordance with the modulation method utilized in signal transmission.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for improving reception in wired and wireless receivers through redundancy and iterative processing, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention provide a method and system for improving reception in receivers employed in wired and wireless systems through redundancy and iterative processing. A multilayer decoding process may comprise a burst process and a frame process. Results from a first burst process may be utilized to generate a decoded bit sequence in the frame process. The frame process may utilize redundancy information and physical constraints to improve the performance of a decoding algorithm. In some voice applications, the decoding algorithm may utilize, for example, a Viterbi algorithm. Results from the frame process may be fed back for a second iteration of the burst process and the frame process, to further improve the decoding operation. In some instances, the second iteration of the burst process may be based on a gradient search approach.

Figure 1A:
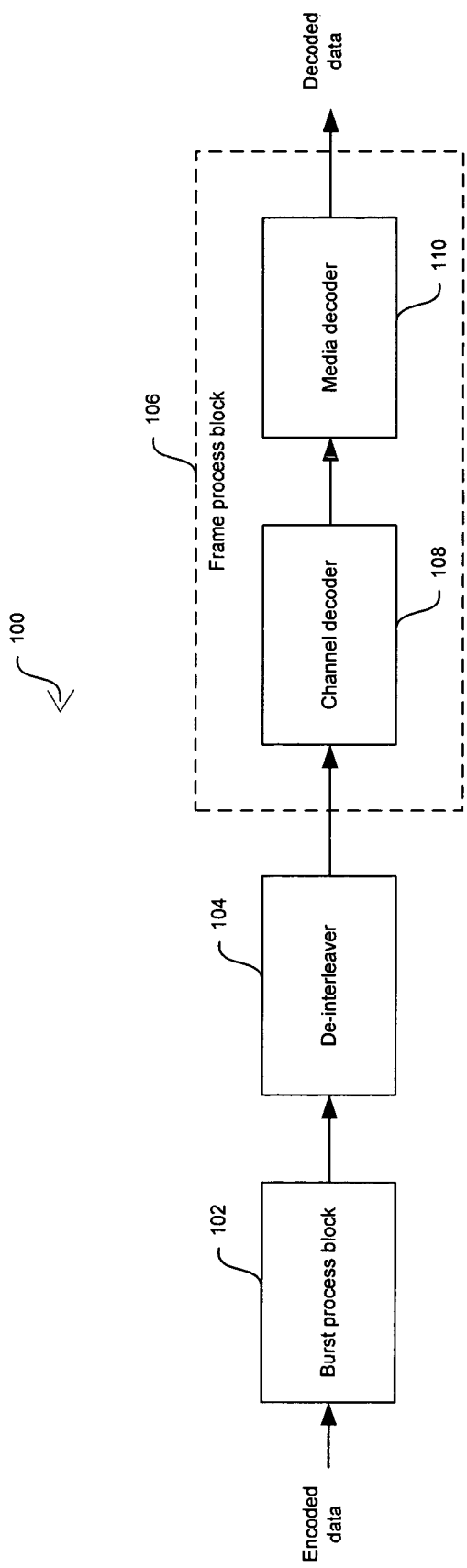
FIG. 1A is a block diagram illustrating a multilayer system for improving decoding, in accordance with an embodiment of the invention.

FIG. 1A is a block diagram illustrating a multilayer system for improving decoding, in accordance with an embodiment of the invention. Referring to FIG. 1A, there is shown a receiver 100 that comprises a burst process block 102, a de-interleaver 104, and a frame process block 106. The frame process block 106 may comprise a channel decoder 108 and a media decoder 110. The receiver 100 may comprise suitable logic, circuitry, and/or code that may be adapted to operate as a wired or wireless receiver. The receiver 100 may be adapted to utilize redundancy to decode interdependent signals, for example, signals that comprise convolutional encoded data. The receiver 100 may also be adapted to utilize a multilayer approach for improving the decoding of interdependent signals or signals with memory. In this regard, the receiver 100 may be adapted to perform a burst process and a frame process when processing the received interdependent signals. The multilayer approach performed by the receiver 100 may be compatible with a plurality of modulation standards.

The burst process block 102 may comprise suitable logic, circuitry, and/or code that may be adapted to perform the burst process portion of the decoding operation of the receiver 100. The burst process block 102 may comprise, for example, a channel estimation operation and a channel equalization operation. Results from the channel estimation operation may be utilized by the channel equalization operation to generate a plurality of data bursts based on a maximum-likelihood sequence estimation (MLSE) operation. The output of the burst process block 102 may be transferred to the de-interleaver 104. The de-interleaver 104 may comprise suitable logic, circuitry, and/or code that may be adapted to multiplex bits from a plurality of data bursts received from the burst process block 102 to form the frame inputs to the frame process block 106. Interleaving may be utilized to reduce the effect of channel fading distortion, for example.

The channel decoder 108 may comprise suitable logic, circuitry, and/or code that may be adapted to decode the bit sequences in the input frames received from the de-interleaver 104. The channel decoder 108 may be adapted to utilize the Viterbi algorithm during a Viterbi operation to improve the decoding of the input frames. The media decoder 110 may comprise suitable logic, circuitry, and/or code that may be adapted to perform content specific processing operations on the results of the channel decoder 108 for specified applications such as MPEG-4, enhanced full-rate (EFR) or adaptive multi-rate (AMR) speech coder used in global system for mobile (GSM) communications, and/or MP3, for example.

Regarding the frame process operation of the decoder 100, a standard approach for decoding convolution encoded data is to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process by the signals source. This inherent redundancy may be utilized in the decoding process by developing a MLSE algorithm that may be adapted to meet at least some of the physical constrains of the signals source. The use of physical constraints in the MLSE may be expressed as finding a maximum of the conditional probability P(X/R), where the sequence X meets a set of physical constrains C(X) and the set of physical constrains C(x) may depend on the source type and on the application. In this regard, the source type may be a voice, music and/or a video source type.

For example, for speech applications, physical constraints may include gain continuity and smoothness in inter-frames or intra-frames, pitch continuity in voice inter-frames or intra-frames, and/or consistency of line spectral frequency (LSF) parameters that are utilized to represent a spectral envelope.

Figure 1B:
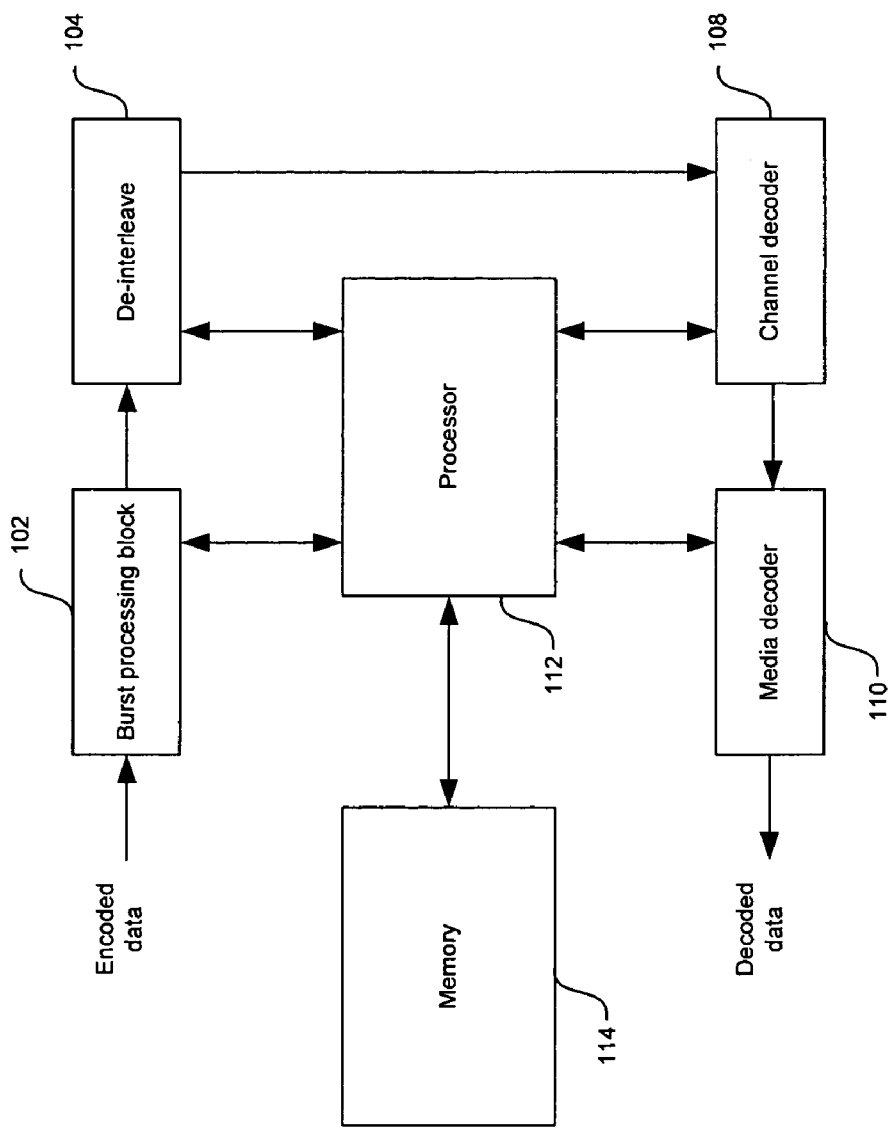
FIG. 1B is a block diagram illustrating a multilayer system with a processor and memory for improving decoding, in accordance with an embodiment of the invention.

FIG. 1B is a block diagram illustrating a multilayer system with a processor and memory for improving decoding, in accordance with an embodiment of the invention. Referring to FIG. 1B, there is shown a processor 112, a memory 114, the burst process block 102, a de-interleaver 104, the channel decoder 108 and the media decoder 110. The processor 112 may comprise suitable logic, circuitry, and/or code that may be adapted to perform computations and/or management operations. The processor 112 may also be adapted to communicate and/or control at least a portion of the operations of the burst process block 102, the de-interleaver 104, the channel decoder 108 and the media decoder 110. The memory 114 may comprise suitable logic, circuitry, and/or code that may be adapted to store data and/or control information. The memory 114 may be adapted to store information that may be utilized and/or that may be generated by the burst process block 102, the de-interleaver 104, the channel decoder 108 and the media decoder 110. In this regard, information may be transferred to and from the memory 114 via the processor 112, for example.

Figure 2A:
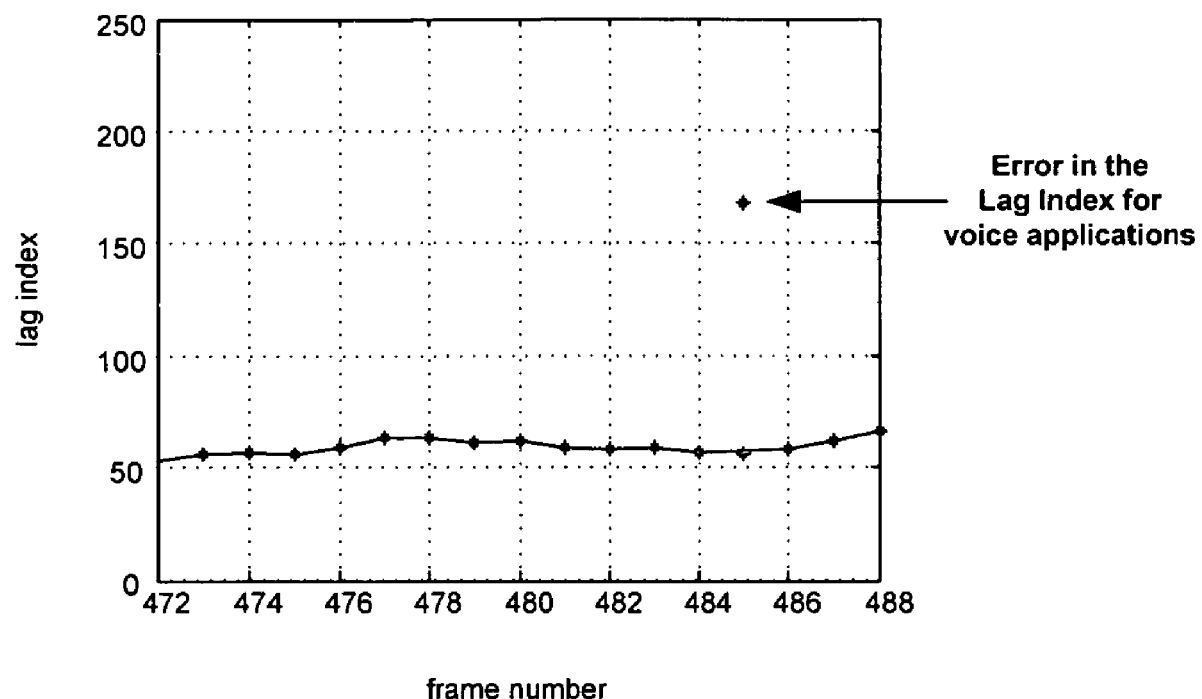
FIG. 2A is a diagram illustrating irregularity in pitch continuity voice frames, which may be utilized in association with an embodiment of the invention.

FIG. 2A is a diagram illustrating irregularity in pitch continuity in voice frames, which may be utilized in association with an embodiment of the invention. Referring to FIG. 2A, there is shown a lag index or pitch continuity as a function of frame number with a non-physical pitch in frame 485 due to bit error. In instances where the lag index may comprise a continuity that results from physical constraints in speech, applying a physical constraint to the decoding operation of the lag index may reduce decoding errors.

For certain data formats, for example, the inherent redundancy of the physical constraints may result from the packaging of the data and the generation of a redundancy verification parameter, such as a cyclic redundancy check (CRC), for the packaged data. Moreover, decoding data generated by entropy encoders or variable length coding (VLC) operations may also meet some internal constraints. For example, VLC operations utilize a statistical coding technique where short codewords may be utilized to represent values that occur frequently and long codewords may be utilized to represent values that occur less frequently.

In video applications, where the video information may be partitioned into frames, blocks, and/or macroblocks, typical constraints may include, for example, continuity between the borders of discrete cosine transform (DCT) blocks, continuity of the DC component between neighboring blocks, continuity of low frequencies between blocks, and/or consistency of data that is coded by a VLC operation.

Figure 2B:
FIG. 2B is a diagram illustrating the effects on an image of errors in the decoding of DCT coefficients, which may be utilized in association with an embodiment of the invention.

FIG. 2B is a diagram illustrating the effects on an image of errors in the decoding of DCT coefficients, which may be utilized in association with an embodiment of the invention. Referring to FIG. 2B, there is shown a plurality of errors that may occur in a reconstructed image when there is an error in decoding the DCT coefficients that may be utilized to inverse transform the image in a video decoder. In this regard, applying a physical constraint to the decoding operation of the DCT coefficients may reduce decoding errors.

In voice transmission applications, such as AMR or EFR in GSM, the physical constraints may be similar to those utilized in general speech applications. Physical constraints in GSM applications may comprise gain continuity and smoothness in inter-frames or intra-frames, pitch continuity in voice inter-frames or intra-frames, continuity of line spectral frequency (LSF) parameters and format locations that are utilized to represent speech. Moreover, GSM applications may utilize redundancy, such as in CRC, as a physical constraint. For example, in GSM applications, enhanced full rate (EFR) coding may utilize 8 and 3 bits for CRC, adaptive multi-rate (AMR) coding may utilize 6 bits for CRC, and GSM half rate (GSM-HR) may utilize 3 bits for CRC. In WCDMA applications, adaptive multi-rate (AMR) coding may utilize 12 bits for CRC, for example.

Regarding the frame process operation of the decoder 100, another approach for decoding convolutional encoded data is to utilize a maximum a posteriori probability (MAP) algorithm. This approach may utilize a priori statistics of the source bits such that a one-dimensional a priori probability, $p(b_i)$, may be generated, where $b_i$ corresponds to a current bit in the bit sequence to be encoded. To determine the MAP sequence, the Viterbi transition matrix calculation may need to be modified. This approach may be difficult to implement in instances where complicated physical constraints and when the correlation between bits $b_i$ and $b_j$, where i and j are far apart, may not be easily determined. In cases where a parameter domain has a high correlation, the MAP algorithm may be difficult to implement. Moreover, the MAP algorithm may not be utilized in cases where inherent redundancy, such as for CRC, is part of the physical constraints.

The maximum-likelihood sequence estimate (MLSE) for a bit sequence may be a preferred approach for decoding convolutional encoded data. A general solution for the maximum of the conditional probability P(X/R), where R meets a certain set of physical constraints C(X), for the MLSE may still be difficult to implement. In this regard, an efficient solution may require a suboptimal solution that takes into consideration complexity and implementation of the physical constraints. The following example illustrates the applications of a multilayer solution that efficiently implements physical constraints into the decoding of voice data in GSM applications.

Figure 3:
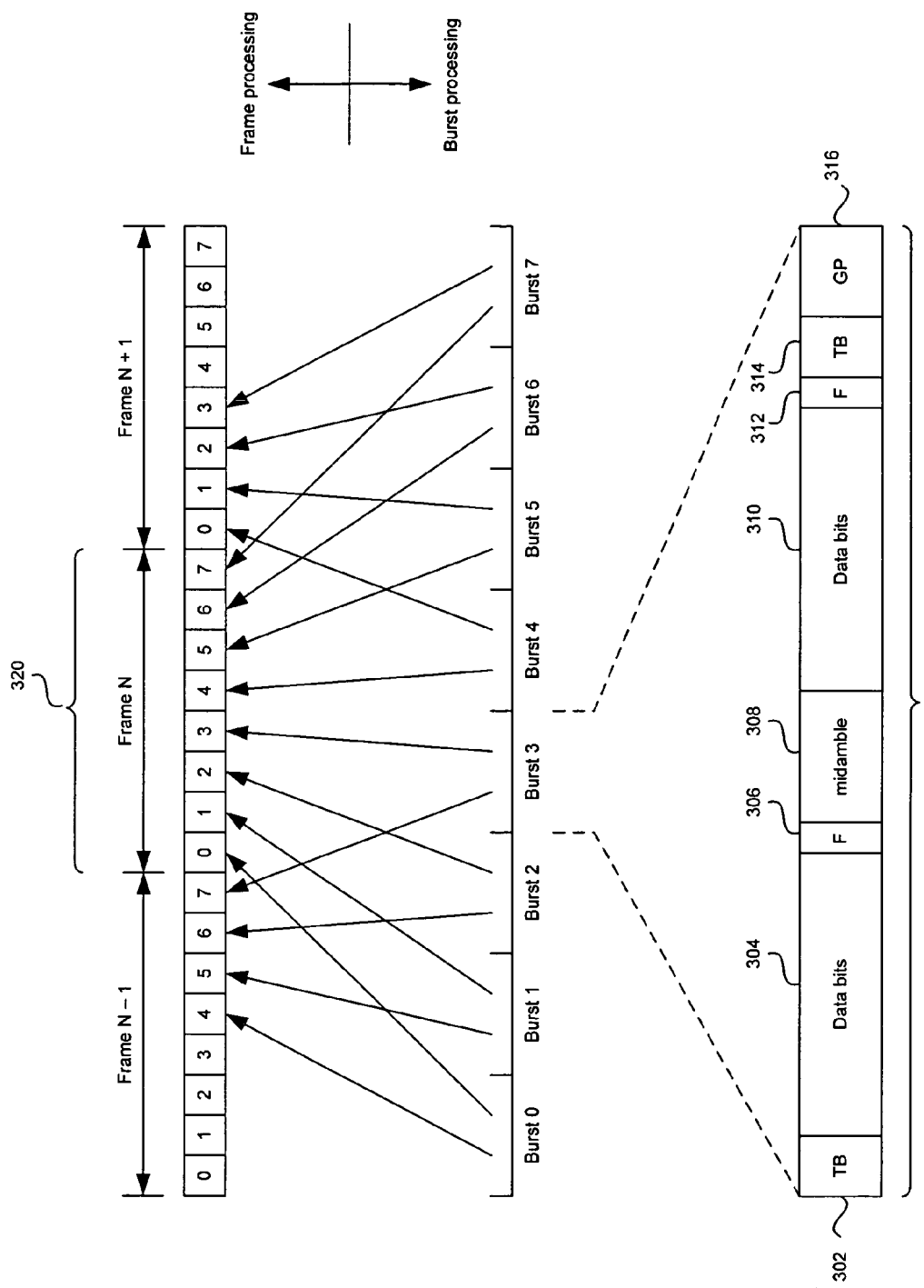
FIG. 3 is a diagram illustrating exemplary combined frame and burst processes in GSM applications, in accordance with an embodiment of the invention.

FIG. 3 is a diagram illustrating exemplary combined frame and burst processes in GSM applications, in accordance with an embodiment of the invention. Referring to FIG. 3, there is shown a series of at least one time slot burst 300 and a series of at least one frame 320. The series of at least one time slot burst 300, as shown, may correspond to Burst 0 through Burst 7, while the series of at least one frame 320, as shown, may correspond to Frame N−1 through Frame N+1. The series of at least one time slot burst 300 may be generated during the burst processing of the receiver 100 in FIG. 1A, while the series of at least one frame 320 may be generated during the frame processing of the receiver 100. The time slot burst 300 may comprise a tail bit (TB) 302, first data bits 304, a flag bit (F) 306, a midamble 308, second data bits 310, a flag bit (F) 312, a tail bit (TB) 314, and guard bits (GP) 316. The TB 302 and the TB 314 may comprise 3 bits each. The first data bits 304 and the second data bits 310 may comprise 57 bits each. The F 306 and the F 312 flag bits may comprise 1 bit each. The midamble 308 may comprise 26 bits and may be utilized as a training sequence for channel equalization, for example. The frame 320 may comprise eight partitions or sequences of bits.

As shown, the first data bits 304 in the Burst 0 through Burst 3 may be transferred to the fifth, sixth, seventh, and eight sequences of the Frame N−1 respectively, for example. The first data bits 304 in the Burst 4 through Burst 7 may be transferred to the fifth, sixth, seventh, and eight sequences of the Frame N respectively, for example. The second data bits 310 in the Burst 0 through Burst 3 may be transferred to the first, second, third, and fourth sequences of the Frame N respectively, for example. The second data bits 310 in the Burst 4 through Burst 7 may be transferred to the first, second, third, and fourth sequences of the Frame N+1 respectively, for example. The decoding of bit sequences transferred from the time slot bursts in the burst processing to the frames in the frame processing may be performed by utilizing the Viterbi algorithm to reduce the number of sequences utilized during the decoding search. In this regard, utilizing signal redundancy and at least one physical constraint may result in a more accurate decoding operation.

Figure 4A:
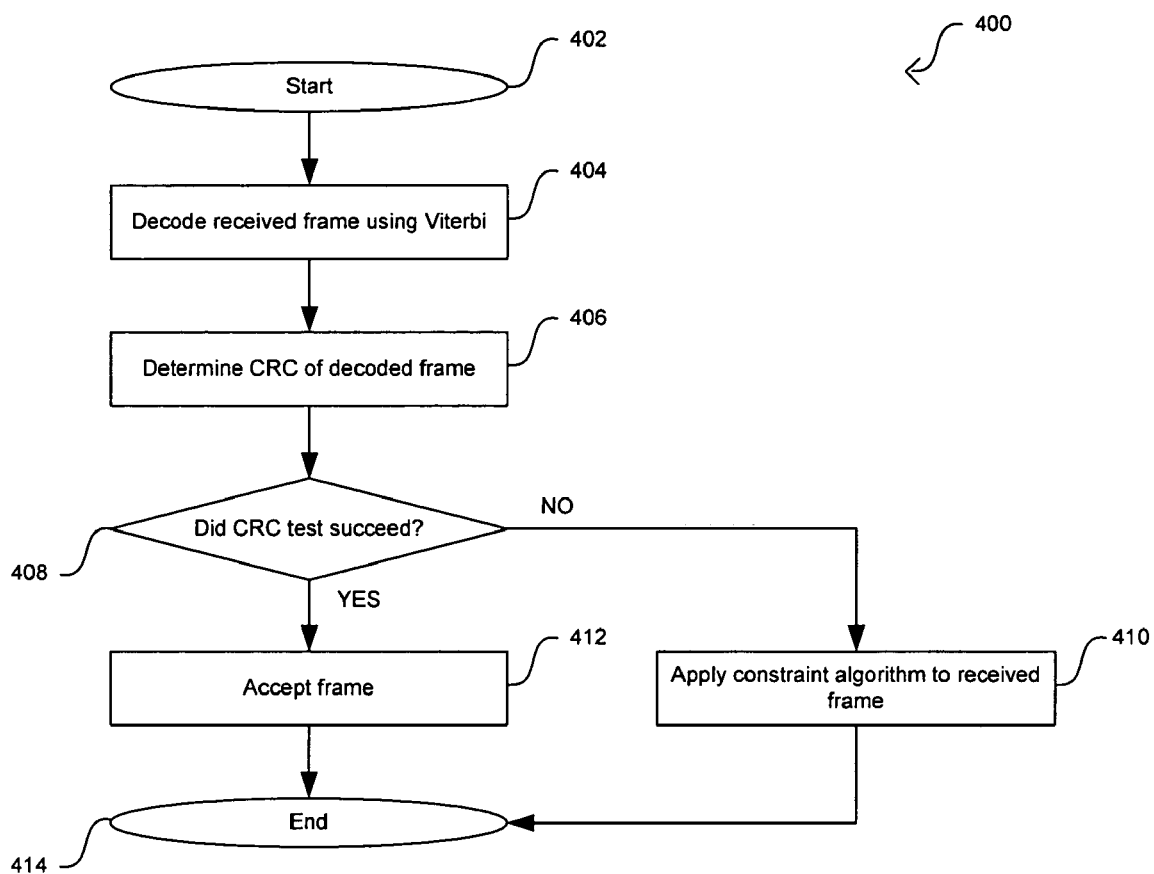
FIG. 4A is a flow diagram illustrating exemplary steps in the application of redundancy to a multilayer process, in accordance with an embodiment of the invention.

FIG. 4A is a flow diagram illustrating exemplary steps in the application of redundancy to a multilayer process, in accordance with an embodiment of the invention. Referring to FIG. 4A, after start step 402, in step 404, the receiver 100 in FIG. 1A may decode a received frame in the frame process block 106 by utilizing the Viterbi algorithm. In step 406, a redundancy verification parameter, such as the CRC, may be determined for the decoded frame. In step 408, the receiver 100 may determine whether the CRC verification test was successful. When the CRC verifies the decoded frame, the receiver 100 may proceed to step 412 where the decoded frame is accepted. After step 412, the receiver 100 may proceed to end step 414.

Returning to step 408, when the CRC verification test is not successful for the decoded frame, the receiver 100 may proceed to step 410. In step 410, the receiver 100 may perform a redundancy algorithm that may be utilized to provide a decoding performance that may result in equal or reduced decoding errors than those that may occur from utilizing the standard Viterbi algorithm. After step 410, the receiver 100 may proceed to end step 414.

For GSM applications, for example, the redundancy algorithm may comprise searching for the MLSE that may also meet the CRC condition and the speech constraints. In this regard, a set of k bit sequences {S1, S2, . . . , Sk} may be determined from the MLSE that meet the CRC constraint. Once the set of k sequences is determined, a best sequence, Sb, may be determined that also meets the GSM voice or speech constraints.

Figure 4B:
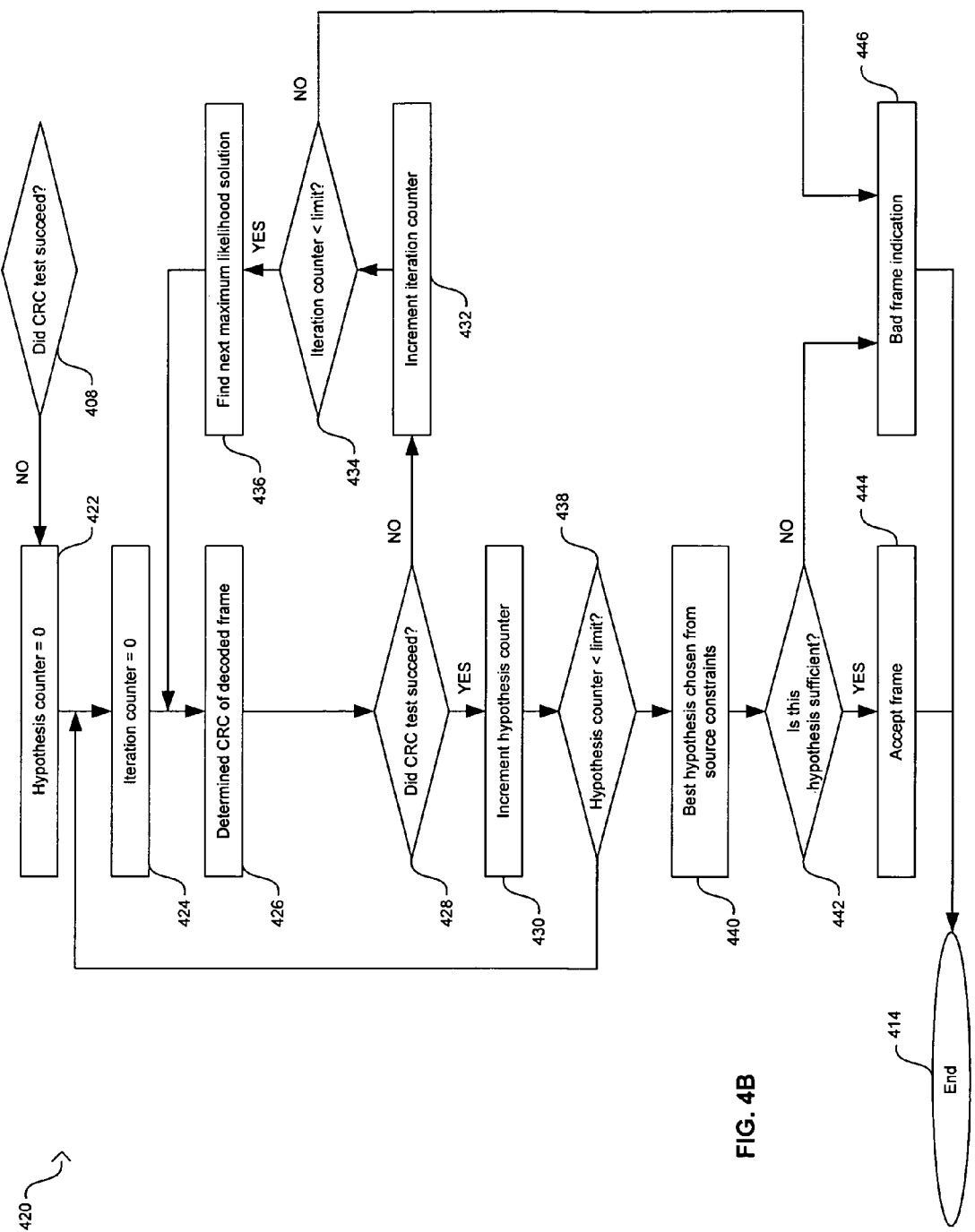
FIG. 4B is a flow diagram illustrating exemplary steps in the application of a constraint algorithm to a received frame, in accordance with an embodiment of the invention.

FIG. 4B is a flow diagram illustrating exemplary steps in the application of a constraint algorithm to a received frame, in accordance with an embodiment of the invention. Referring to FIG. 4B, when the CRC verification test is not successful for the decoded frame in step 408 in FIG. 4A, the receiver 100 in FIG. 1A may proceed to step 422. In step 422, a hypothesis counter may be set to an initial counter value to indicate a first hypothesis for consideration, for example. The initial counter value in step 422 may be zero, for example. After step 422, an iteration counter may be set to an initial counter value in step 424 to indicate a first maximum likelihood solution, for example. The initial counter value in step 424 may be zero, for example. In step 426, the CRC of the decoded frame may be determined.

In step 428, the receiver 100 may determine whether the CRC verification test was successful for the current hypothesis. When the CRC verification test is not successful, the operation may proceed to step 432. In step 432, the iteration counter may be incremented. After step 432, in step 434, the receiver 100 may determine whether the iteration counter is less than a predetermined limit. When the iteration counter is higher or equal to the predetermined limit, the operation may proceed to step 446 where a bad frame indication is generated. When the iteration counter is less than the predetermined limit, the operation may proceed to step 436 where a next maximum likelihood solution may be determined. After step 436, the operation may proceed to step 426 where the CRC of the decoded frame may be determined based on the maximum likelihood solution determined in step 426.

Returning to step 428, when the CRC verification test is successful, the operation may proceed to step 430. In step 430, the hypothesis counter may be incremented. After step 430, in step 438, the receiver 100 may determine whether the hypothesis counter is less than a predetermined limit. When the hypothesis counter is less than the predetermined limit, the operation may proceed to step 424 where the iteration counter may be set to an initial value. When the hypothesis counter is equal the predetermined limit, the operation may proceed to step 440 where the best hypothesis may be chosen from the source constraints.

After step 440, in step 442, the receiver 100 may determine whether the best hypothesis chosen in step 440 is sufficient to accept the decoded frame. When the chosen hypothesis is sufficient to accept the decoded frame, the operation may proceed to step 444 where the decoded frame may be accepted. When the chosen hypothesis is not sufficient to accept the decoded frame, the operation may proceed to step 446 where a bad frame indication is generated. After step 444 or step 446, the operation may proceed to end step 414 in FIG. 4A.

Figure 5A:
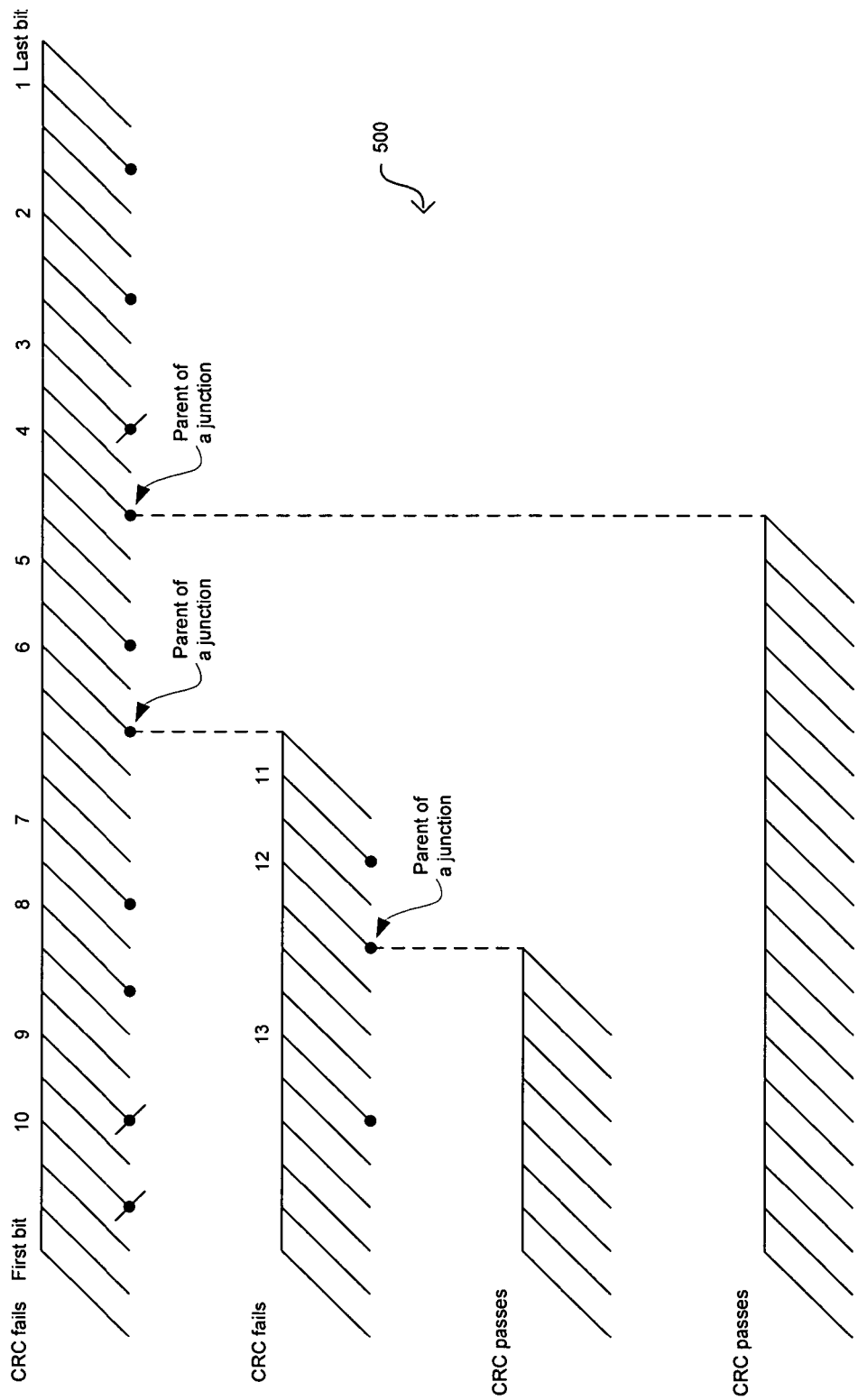
FIG. 5A is diagram illustrating an exemplary search process for a T hypothesis that meets CRC constraint, in accordance with an embodiment of the invention.

FIG. 5A is diagram illustrating an exemplary search process for a T hypothesis that meets CRC constraint, in accordance with an embodiment of the invention. Referring to FIG. 5A, the search tree 500 may correspond to an exemplary sequence search process that may start with the reduced set of estimated bit sequences generated by a Viterbi operation. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the CRC constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the CRC or redundancy verification parameter for GSM may start with the selected trellis junction with the highest metric. In this example, the junction labeled 6 has the highest metric and the search process may start at that point. A new search tree 500 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for CRC. As shown, the CRC fails for this new branch and a next branch may be created from the junction with the highest metric or junction 12 as shown. In this instance, the branch that results from junction 12 meets the CRC constraint and the search process may return to the top row and to the junction with the next highest metric. The estimated bit sequence associated with junction 12 may be selected as one of the bit sequences for the set of k sequences {S1, S2, . . . , Sk}.

Junction 4 represents the next highest metric after junction 6 on the top row and a new branch or row may be created from junction 4. In this instance, the new branch meets the CRC constraint and the estimated bit sequence associated with junction 4 may be selected as one of the bit sequences for the set of k sequences {S1, S2, . . . , Sk}. This approach may be followed until the limit of k sequences is exceeded or the search from all the remaining selected junctions is performed. In this regard, a plurality of trace back pointers may be calculated during the search operation. The size of the set of k bit sequences {S1, . . . , Sk} may vary.

Figure 5B:
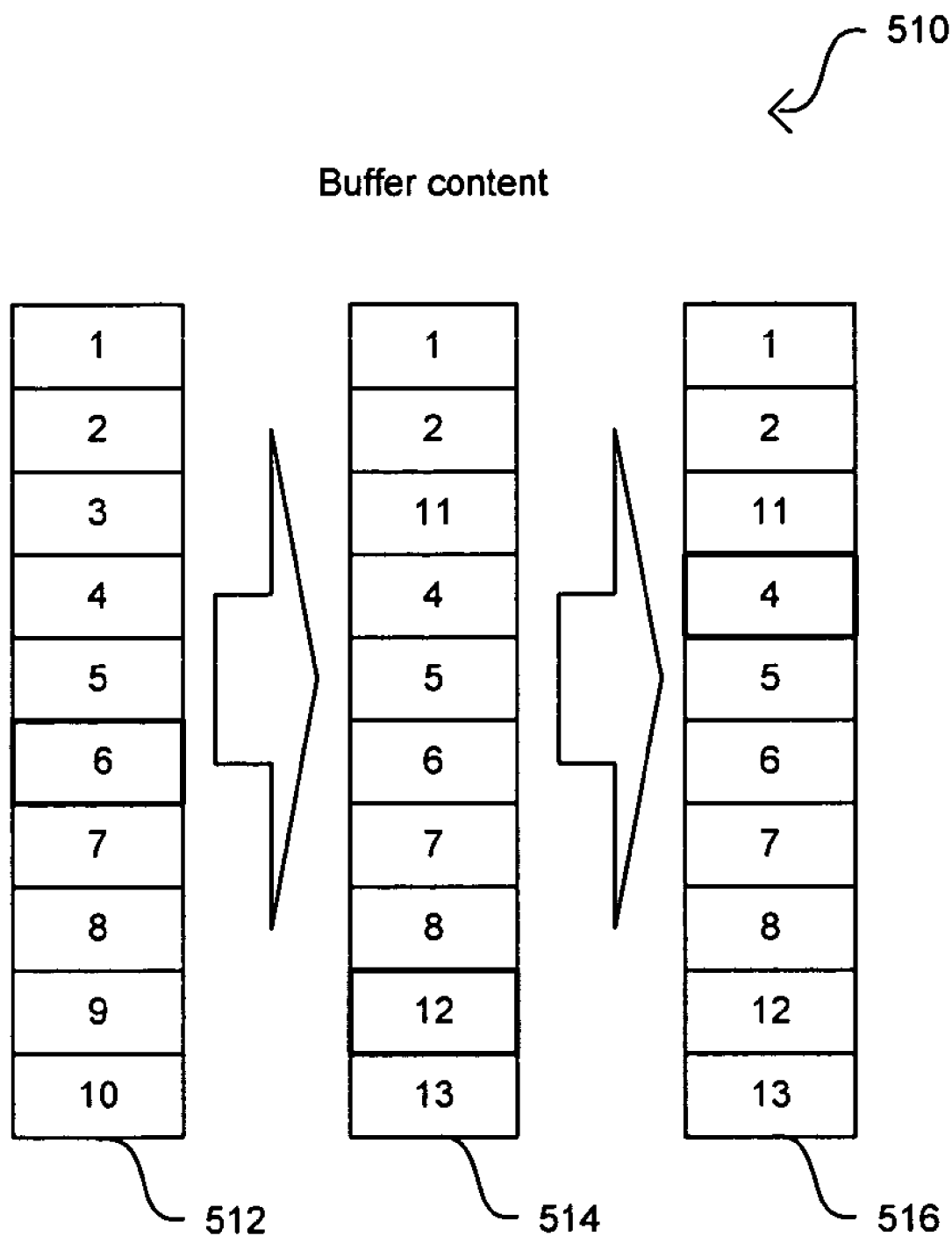
FIG. 5B is a diagram illustrating exemplary buffer content during the search process described in FIG. 5A, in accordance with an embodiment of the invention.

FIG. 5B is a diagram illustrating exemplary buffer content during the search process described in FIG. 5A, in accordance with an embodiment of the invention. Referring to FIG. 5B, there is shown a buffer content 510 that may correspond to the junction labels under consideration during the search process. For example, state 512 may correspond to the initial 10 junctions in the search operation. In this regard, junction 6 is highlighted to indicate that it corresponds to the highest metric value and is the starting point of a new branch or row. Step 514 may correspond to the next set of 10 junctions. In this instance, junctions 3, 9, and 10 have been replaced with junctions 11, 12, and 13 that resulted from the branch created from junction 6. Junction 12 is highlighted to indicate that is corresponds to the highest metric value and is the starting point of a new branch or row. State 516 may correspond to the next set of 10 junctions. In this instance, junction 4 is highlighted to indicate that is corresponds to the highest metric value and is the starting point of a new branch or row. Trace back pointers may be calculated at each state to track the search process.

Figure 5C:
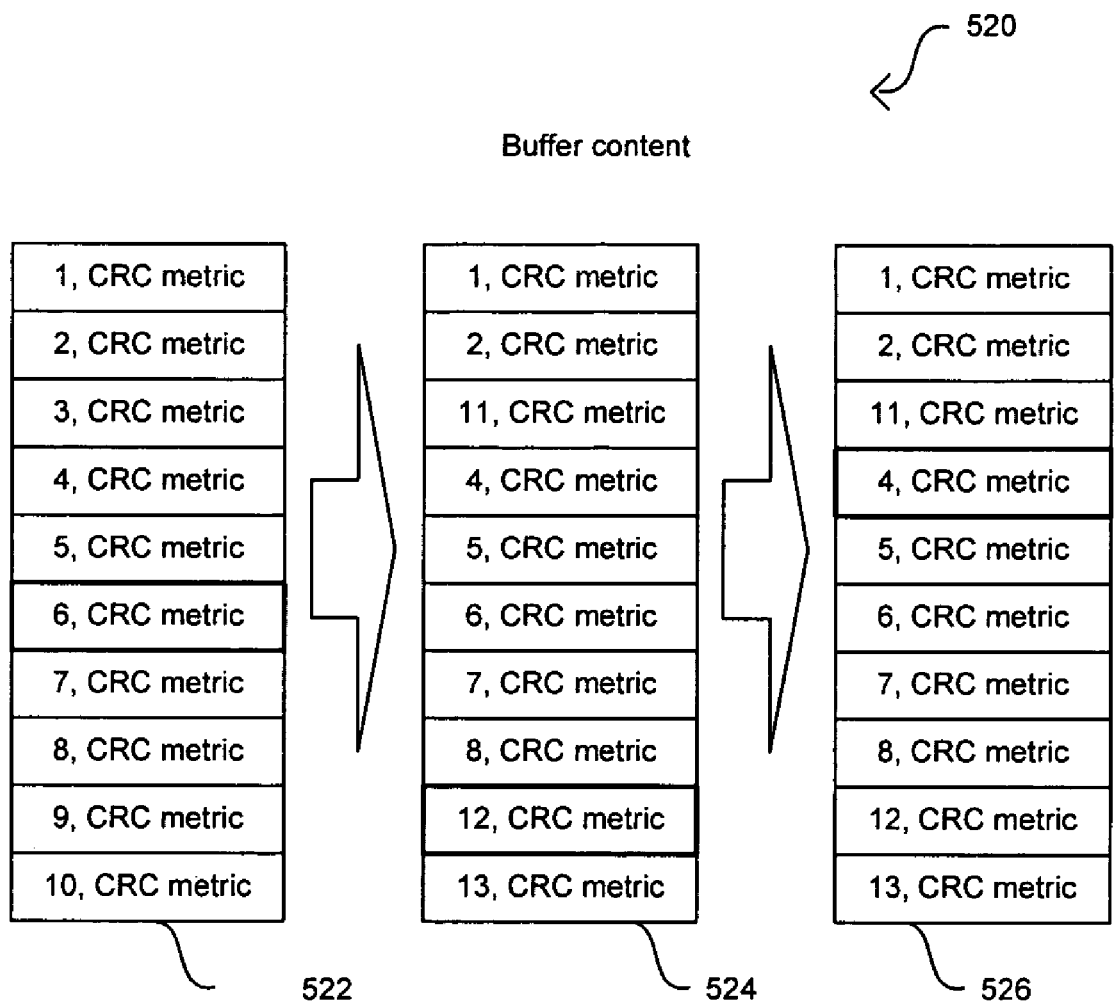
FIG. 5C is a diagram illustrating exemplary buffer content when CRC and trace back pointers are calculated simultaneously during the search process described in FIG. 5A, in accordance with an embodiment of the invention.

FIG. 5C is a diagram illustrating exemplary buffer content when CRC and trace back pointers are calculated simultaneously during the search process described in FIG. 5A, in accordance with an embodiment of the invention. Referring to FIG. 5C, there is shown a buffer content 520 that may correspond to the junction labels under consideration during the search process and the corresponding CRC calculations. As with FIG. 5B, the buffer content 520 may vary its contents based on a current state. For state 522, state 524, and state 526, the contents that correspond to the current junctions under consideration are the same as in state 512, state 514, and state 516 in FIG. 5B respectively. However, in order to simplify the search process for T hypothesis, the CRC and the trace back pointers for the states may be calculated simultaneously. This approach is possible because the CRC may be calculated as sum($b_i R_i$), where $R_i$ is the remainder of $xi/g(x)$, $g(x)$ is the generator polynomial of the CRC, and $b_i$ is the value of the bit i. The CRC metric of each sequence may be kept or stored in the buffer content 520. The CRC metric may be obtained as the sum of the biRi values from the junction to the last bit, and may also be determined as the sum of the parent sequence CRC metric and sum of the biRi values from junction to its parent. The sequence may meet the CRC condition if the CRC metric is equal to the sum of the biRi values from first bit to the junction. The values for $R_i$ may be stored in, for example, a look up table.

Once the set of k sequences {S1, S2, . . . , Sk} has been determined by following the search as described in FIGS. 5A-5C, the redundancy algorithm may require that the receiver 100 in FIG. 1A selects one of the bit sequences as the best bit sequence, Sb, that meets the CRC constrain and the physical constrains with the highest level of confidentiality. The best bit sequence may also be referred to as the decoded output bit sequence of the multilayer process.

For each of the candidate bit sequences in the set of k bit sequences {S1, S2, . . . , Sk}, a set of T1 different physical constraint tests, {Test(j), . . . , Test(T1)}, may be performed. The physical constraint tests correspond to tests of quantifiable characteristics of the type of data received for a particular application. The scores of the physical constraint tests for an $i^{th}$ bit sequence, {T_SC(i, j), . . . , T_SC(i, T1)}, may be utilized to determine whether the bit sequence passed or failed a particular test. For example, when T_SC(i, j)>0, the $i^{th}$ bit sequence is said to have failed the $j^{th}$ physical constraint test. When the T_SC(i, j)<=0, the $i^{th}$ bit sequence is said to have passed the $j^{th}$ physical constraint test. In some instances, when the value of a test score is smaller, the reliability of the score may be increased.

Once the physical constraint tests are applied to the candidate estimated bit sequences, the following exemplary approach may be followed: when a score is positive, the candidate bit sequence may be rejected; for a particular physical constraint test, the candidate with the best score or with the lowest score value may be found; the candidate that is selected as the best score for the most number of tests may be selected as the best bit sequence, Sb.

TABLE 1

| Candidate | Test (1) | Test (2) | Test (3) | Test (4) |
|---|---|---|---|---|
| S1 | Score (1,1) < 0 | Score(1,2) < 0 | Score(1,3) < 0 | Score(1,4) < 0 |
| S2 | Score (2,1) < 0 | Score(2,2) > 0 | Score(2,3) < 0 | Score(2,4) < 0 |
| S3 | Score (3,1) < 0 | Score(3,2) < 0 | Score(3,3) < 0 | Score(3,4) < 0 |
| S4 | Score (4,1) < 0 | Score(4,2) < 0 | Score(4,3) < 0 | Score(4,4) > 0 |
| S5 | Score (5,1) < 0 | Score(5,2) < 0 | Score(5,3) < 0 | Score(5,4) < 0 |
| Minimum score sequence | S3 | S5 | S3 | S3 |

Table 1 illustrates an exemplary embodiment of the invention in which a set of five candidate bit sequences, {S1, S2, S3, S4, and S5}, may be tested using a set of four physical constraint tests, {Test(1), Test(2), Test(3), and Test(4)}. The scores may be tabulated to identify passing and failing of various tests for each of the candidate bit sequences. In this instance, S2 and S4 are rejected for having positive scores for Test(2) and Test(4) respectively. The bit sequence S3 is shown to have the lowest score in Test(1), Test(3), and Test(4) and may be selected as the best bit sequence, Sb.

Some characteristic physical constraint tests that may be utilized by, for example, adaptive multi-rate (AMR) coding are LSF parameters, gain, and/or pitch. For the LSF parameters, some of the tests may be based on the distance between two formants, changes in consecutive LSF frames or sub-frames, and the effect of channel metrics on the thresholds. For example, the smaller the channel metric, the more difficult it is to meet the threshold. Regarding the use of gain as a physical constraint test, the criteria may be smoothness or consistency between consecutive frames or sub-frames. Regarding pitch, the criteria may be the difference in pitch between frames or sub frames.

Figure 6:
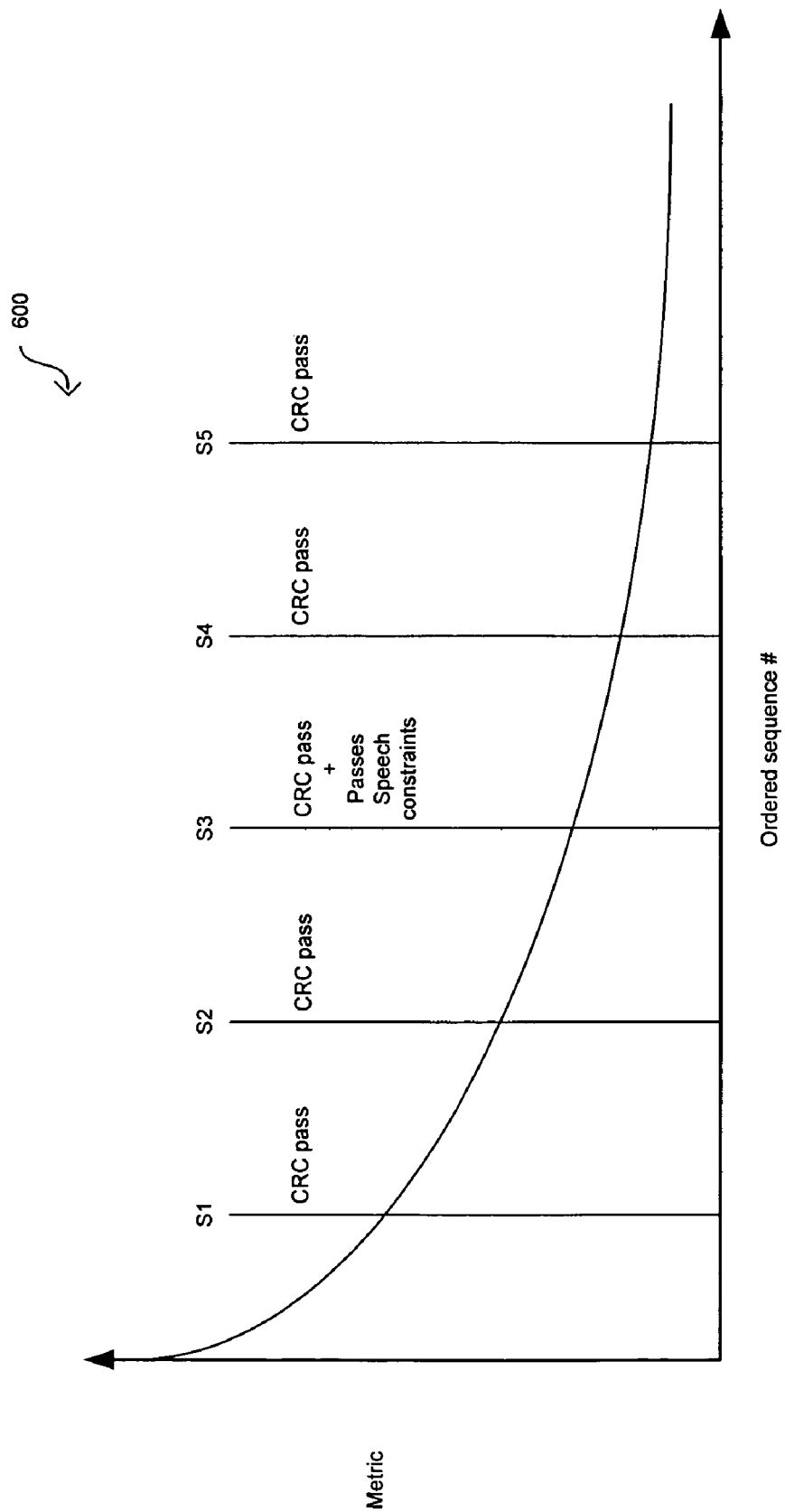
FIG. 6 is a graph illustrating exemplary set of sequences that meets CRC and speech constraints, in accordance with an embodiment of the invention.

FIG. 6 is a graph illustrating exemplary set of sequences that meets CRC and speech constraints, in accordance with an embodiment of the invention. Referring to FIG. 6, there is shown the result of the redundancy algorithm. For example, the search process for T hypothesis as shown in FIGS. 5A-5C may result in the set of bit sequences {S1, S2, S3, S4, and S5}. These bit sequences were selected based on their metric values and passing the CRC verification. The set of bit sequences were also required to pass physical constraint tests as described herein. In this instance, the bit sequence S3 has been shown to meet the CRC verification and the physical constraint test and may be selected as the best bit sequence, Sb.

Figure 7:
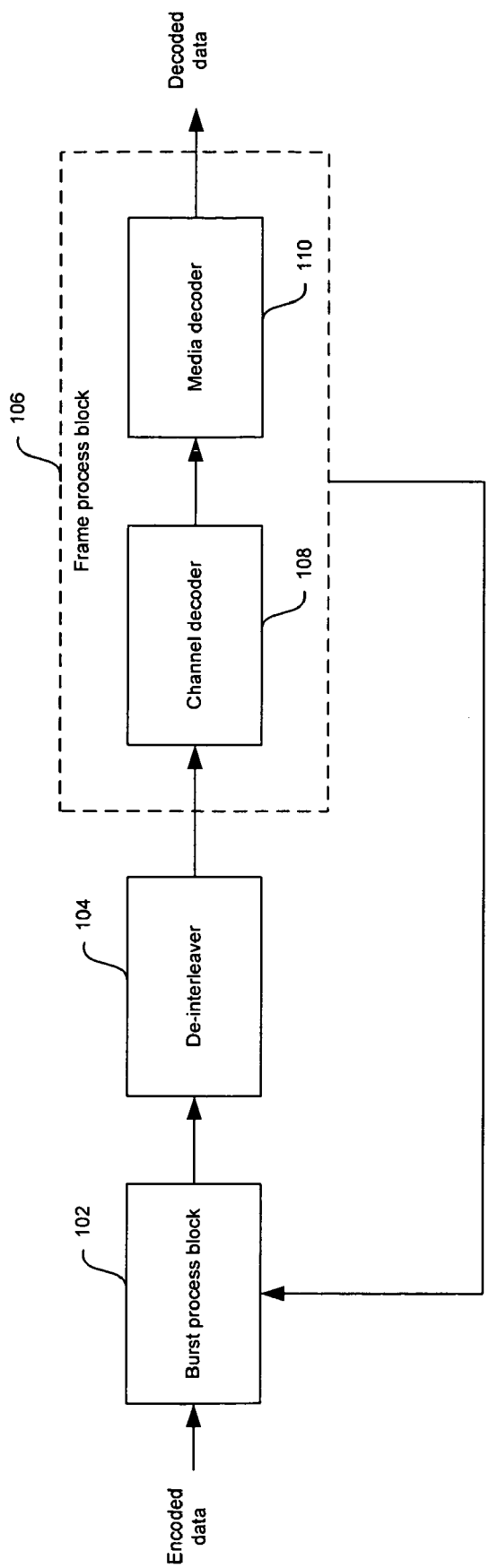
FIG. 7 is a block diagram illustrating an iterative multilayer approach for improving decoding, in accordance with an embodiment of the invention.

FIG. 7 is a block diagram illustrating an iterative multilayer approach for improving decoding, in accordance with an embodiment of the invention. Referring to FIG. 7, there is shown the receiver 100 in FIG. 1A with a feedback signal from the frame process portion of the multilayer decoding approach to the burst process portion of the multilayer decoding approach. The frame process may comprise the use of redundancy verification of the results generated by the Viterbi algorithm and the use of physical constraints to reduce decoding errors that may result from the standard Viterbi algorithm. The burst process may utilize information decoded in the frame process as an input to improve the channel estimation and channel equalization operations.

Figure 8:
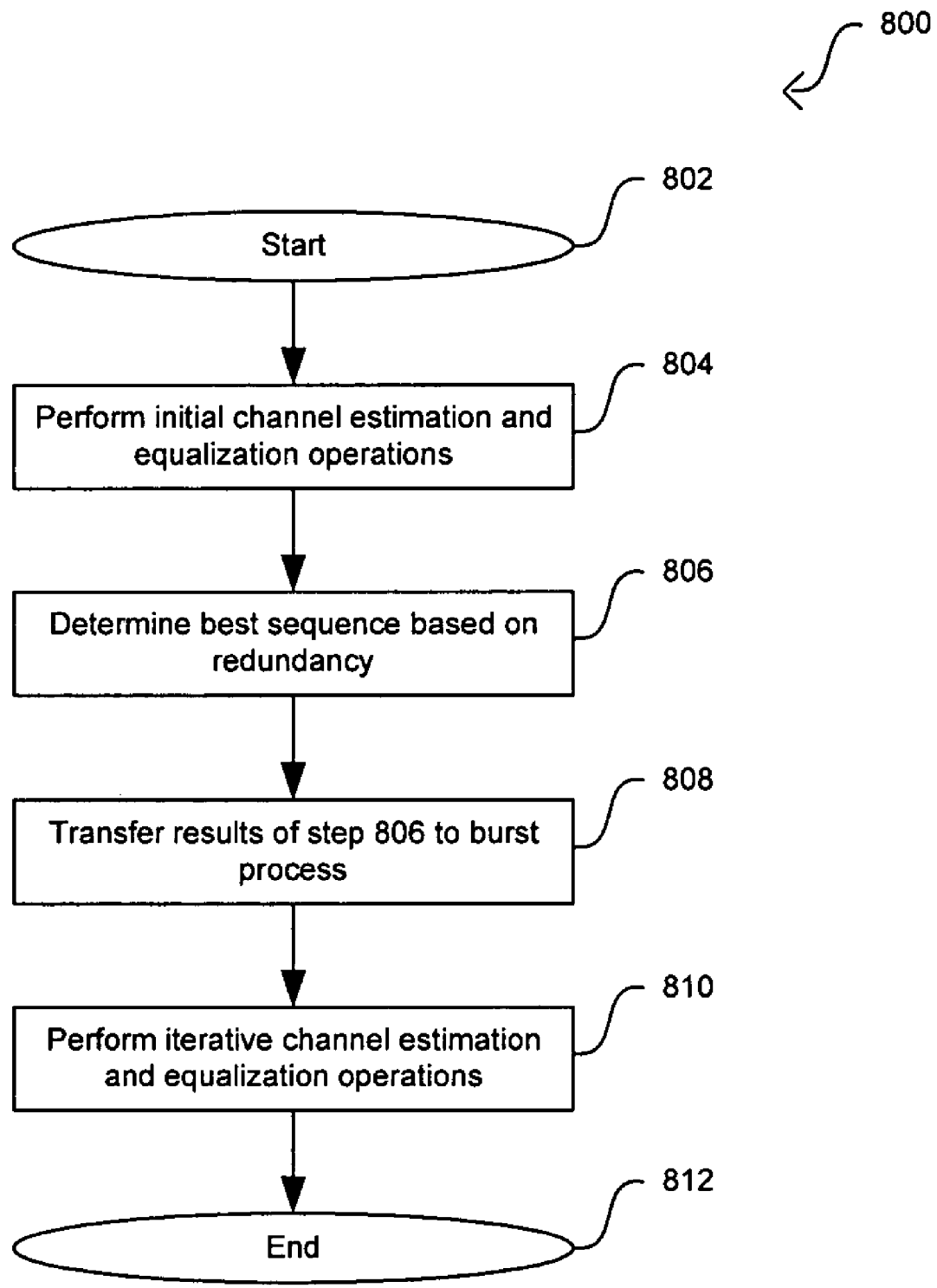
FIG. 8 is a flow diagram illustrating exemplary steps in the iterative multilayer approach for improving decoding, in accordance with an embodiment of the invention.

FIG. 8 is a flow diagram illustrating exemplary steps in the iterative multilayer approach for improving decoding, in accordance with an embodiment of the invention. Referring to FIG. 8, after start step 802, in step 804, an initial or first iteration of a channel estimation operation and of an equalization operation may be performed on received signals during a burst process portion of the multilayer decoding approach. The first iteration of the channel estimation operation and the first iteration of the equalization operation may be performed by, for example, the burst process block 102 in FIG. 7. In step 806, decoding of a received signal frame may be performed during the frame processing portion of the multilayer decoding approach. The frame processing may be performed by, for example, the frame process block 106 in FIG. 1. In step 808, at least a portion of the results generated in step 806 by the frame process portion of the multilayer decoding approach may be transferred from, for example, the frame process block 106 to the burst process block 102 via a feedback signal. In step 810, the burst processing may perform a second iteration of the channel estimation operation and a second iteration of the equalization operation based on the decoded results provided from the frame process portion of the multilayer decoding approach. After step 810, the flow diagram 800 may proceed to end step 812. The improved results of the burst process may be further interleaved and processed by the frame process. The frame process may utilize a standard frame process or determine the best sequence that may be utilized based on, for example, redundancy.

The iterative multilayer approach described in FIG. 8 may be utilized in a many different applications, for example, in digital video broadcasting (DVB), digital audio broadcasting (DAB), and in wireless applications, such as those that support 2G, 2.5G and 3G technologies. In this regard, the iterative multilayer approach may be utilized in GSM applications, for example.

Figure 9:
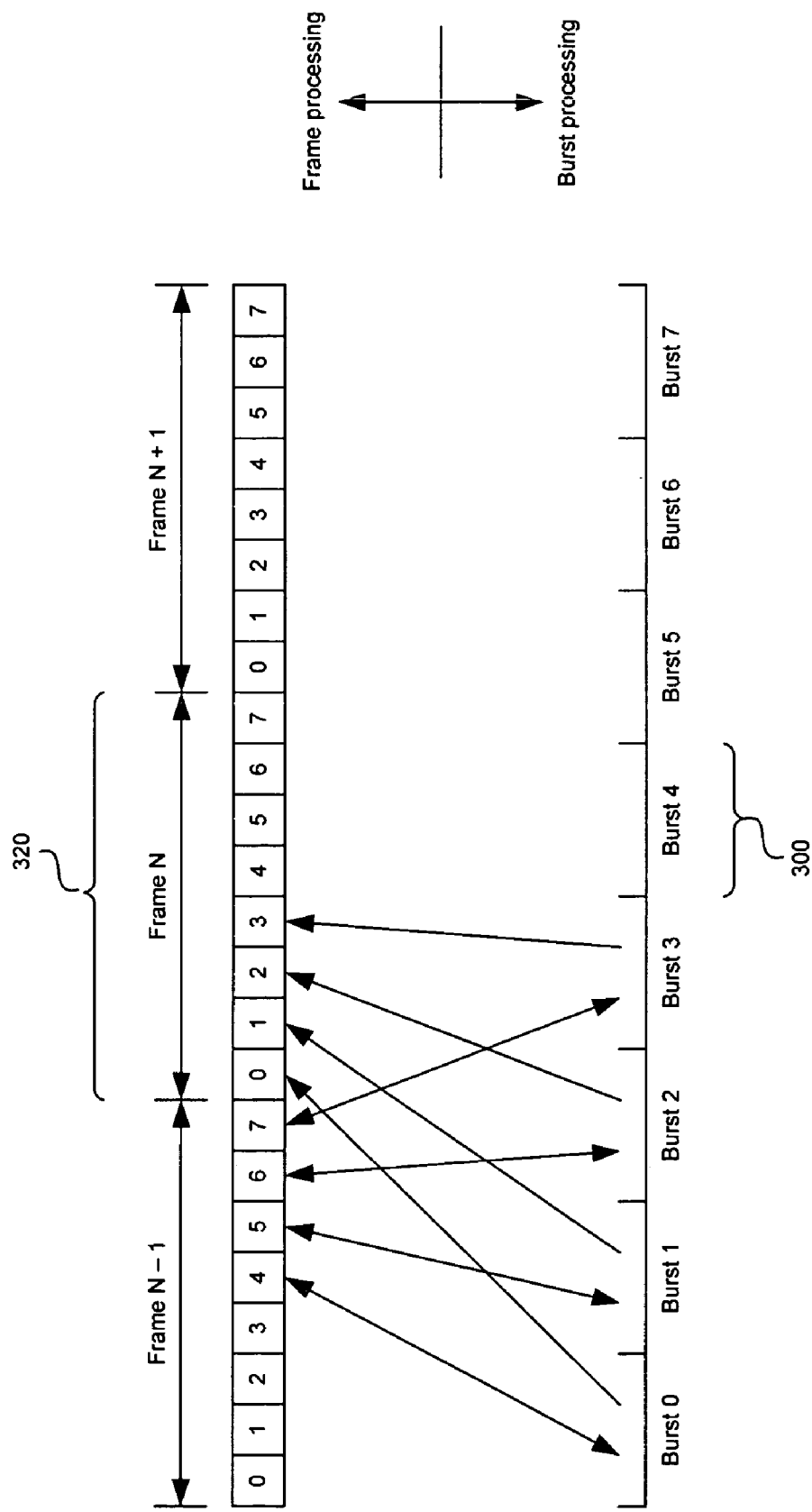
FIG. 9 is a diagram illustrating exemplary iterative frame and burst processes in GSM applications, in accordance with an embodiment of the invention.

FIG. 9 is a diagram illustrating exemplary iterative frame and burst processes in GSM applications, in accordance with an embodiment of the invention. Referring to FIG. 9, there is shown a series of at least one time slot burst 300 and a series of at least one frame 320 as illustrated in FIG. 3. The series of at least one time slot burst 300 may correspond to Burst 0 through Burst 7, while the series of at lest one frame 320 may correspond to Frame N−1 through Frame N+1.

There may be two types of iterative processes to consider: a causal iterative process and a non-causal iterative process. For the causal iterative process, Burst 0 through Burst 3 may each have 57 data bits from the first data bits 304 portion of the time slot burst 300 that have been decoded during the frame processing of Frame N−1. Utilizing the decoded 57 data bits in each of Burst 0 through Burst 3 and the 26 bits in the midamble 308, the burst process may be recalculated or a second iteration of the burst process may occur. In this regard, the channel estimation operation of the burst process may be improved by utilizing the decoded data bits generated by the frame process during a second iteration. Moreover, the MLSE in the channel equalization operation of the burst process may consider that the decoded data bits are known with a higher probability than during the first iteration. In some instances, to reduce the complexity that may be introduced by a second iteration operation, the burst process may be adapted to perform a second iteration on selected time slot bursts determined during the first iteration. In this regard, a particular time slot burst may be selected for a second iteration when it is associated with having a low carrier-to-interference (C/I) value, for example. Once the burst process improves the data, it may be further interleaved and processed by the frame process. The frame process my use a standard frame process or determine the best sequence based on, for example, the redundancy For the non-causal iterative process, bits from Burst 0 through Burst 7 may be needed to recalculate the burst process for bit sequences that may be transferred to Frame N. Data from Frame N−1 and/or data from Frame N+1 may be utilized to calculate the burst process for bit sequences that may be transferred to Frame N. Utilizing the decoded 114 data bits in each of Burst 0 through Burst 7 and the 26 bits in the midamble 308, the burst process may be recalculated. As with the causal iterative process, a particular time slot burst may be selected for a second iteration when it is associated with having a low carrier-to-interference (C/I) value, for example.

Figure 10:
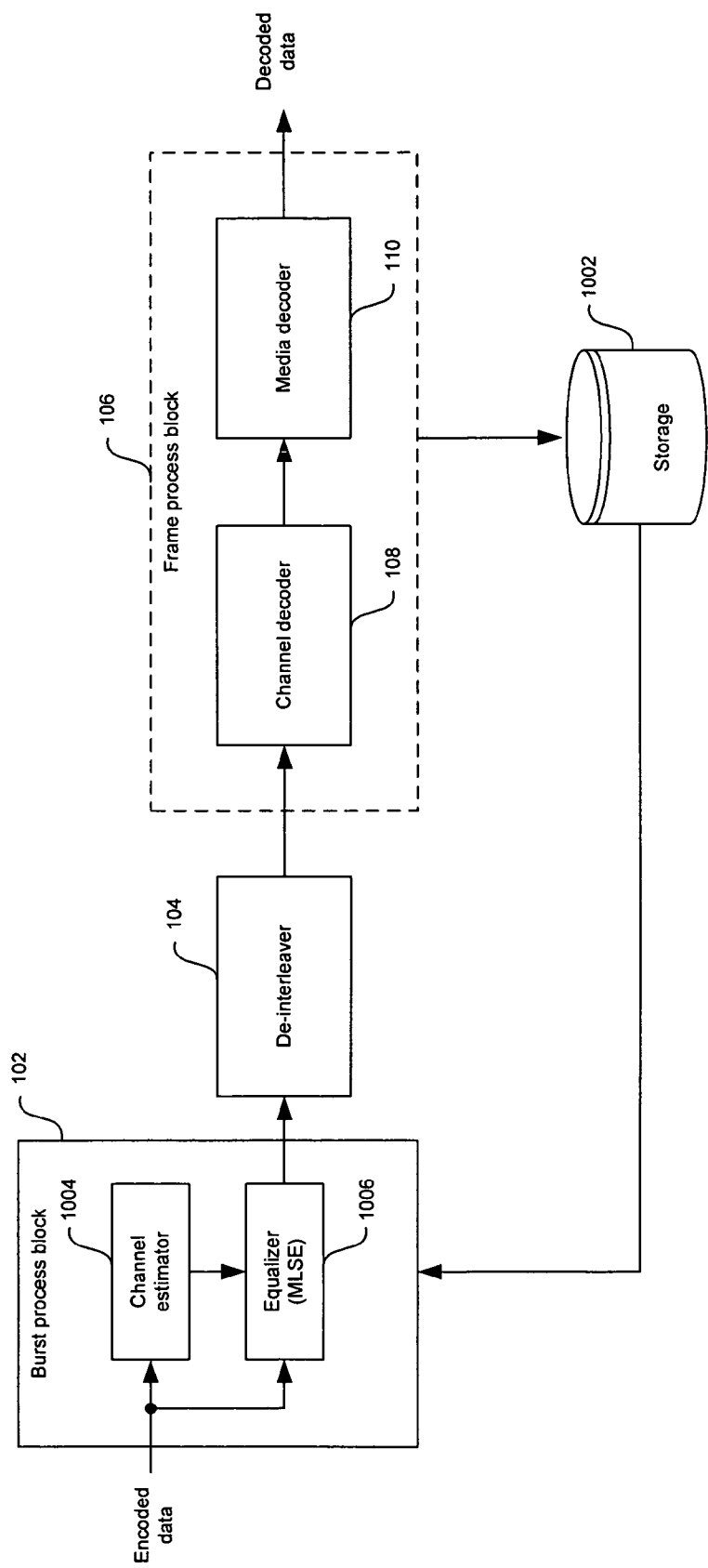
FIG. 10 is a block diagram illustrating exemplary non-causal iterative system, in accordance with an embodiment of the invention.

FIG. 10 is a block diagram illustrating an exemplary non-causal iterative system, in accordance with an embodiment of the invention. Referring to FIG. 10, there is shown the burst process block 102, the de-interleaver 104, the frame process block 106, the channel decoder 108, the media decoder 110, and a storage 1002. The burst process block 102 is shown to comprise a channel estimator 1004 and an equalizer 1006. The storage 1002 may comprise suitable logic, circuitry, and/or or code that may be adapted to store data associated with the frame process of a previously processed frame. The channel estimator 1004 may comprise suitable logic, circuitry, and/or code that may be adapted to perform channel estimation operations during the burst process. The equalizer 1006 may comprise suitable logic, circuitry, and/or code that may be adapted to perform MLSE channel equalization operations during the burst process.

In operation, data stored in the storage 1002 that resulted from a frame process operation may be transferred to the channel estimator 1004 and/or the equalizer 1006 for a second iteration of the burst process for the Frame N. In this regard, the data stored in the storage 1002 may comprise information regarding the time slot bursts in the burst process that may be utilized during the second iteration of the burst process for the Frame N.

When using the 57 data bits and the 26 midamble bits in the causal iterative process or when using 114 data bits and the 26 midamble data bits in the non-causal iterative process, hard decision values or soft decision values for the data bits may be utilized during the second iteration of the burst process. In some instances, soft decision values may be preferred for a particular application.

The channel estimator 1004 in FIG. 10 may be adapted to perform a soft decision for the burst process. For example, for Gaussian minimum shift keying (GMSK) modulation, the estimated channel may be given by the expression:

$$\hat{W}(m) = \frac{1}{\text{Gain}} \cdot \sum_{n=0}^{N} j^n \cdot x_n \cdot S(m+n),$$

where $\hat{A}_n = j^n \cdot \overline{A}_n$ and $\overline{A}_n = \pm 1$, and the soft reference is given by $x_n = \alpha_n \cdot \overline{A}_n$, where $\alpha_n$ is a weight of the soft decision, and m=0, 1, 2, . . . 7. In this regard, the gain for the estimated channel may be given by the expression:

$$\text{Gain} = \sum_{n=0}^{N} \frac{|x_n|}{(1 - 2 \cdot P_{ER}^n)},$$

where N=147, and $$x_n = \begin{cases} \pm 1 & \text{If (Bit} \in \text{Midamble)} \\ 0.3625 \cdot SD_n / 15 & \text{If (Bit} \in \text{Prev} - \text{Iteration)} \end{cases},$$

where $SD_n$ refers to a soft decision value. The gain for the estimated channel may be simplified to the expression:

$$\text{Gain} = \sum_{n=0}^{N} \frac{|x_n|}{(1 - 2 \cdot P_{ER}^n)} \approx 0.825 \cdot \sum_{n=0}^{147} |x_n|.$$

The offset and the estimation may be determined by the expression $$E(\text{Ofser}) = \sum_{k=0}^{4} |\hat{W}(k + \text{Offset})|^2.$$

In instances when the equalizer 1006 in FIG. 10 is not adapted to handle the results from a previous iteration, a gradient search approach may be utilized for the second iteration in the burst process. In this regard, the first iteration may be performed in hardware and at least a portion of the second iteration may be performed in software, for example.

Figure 11:
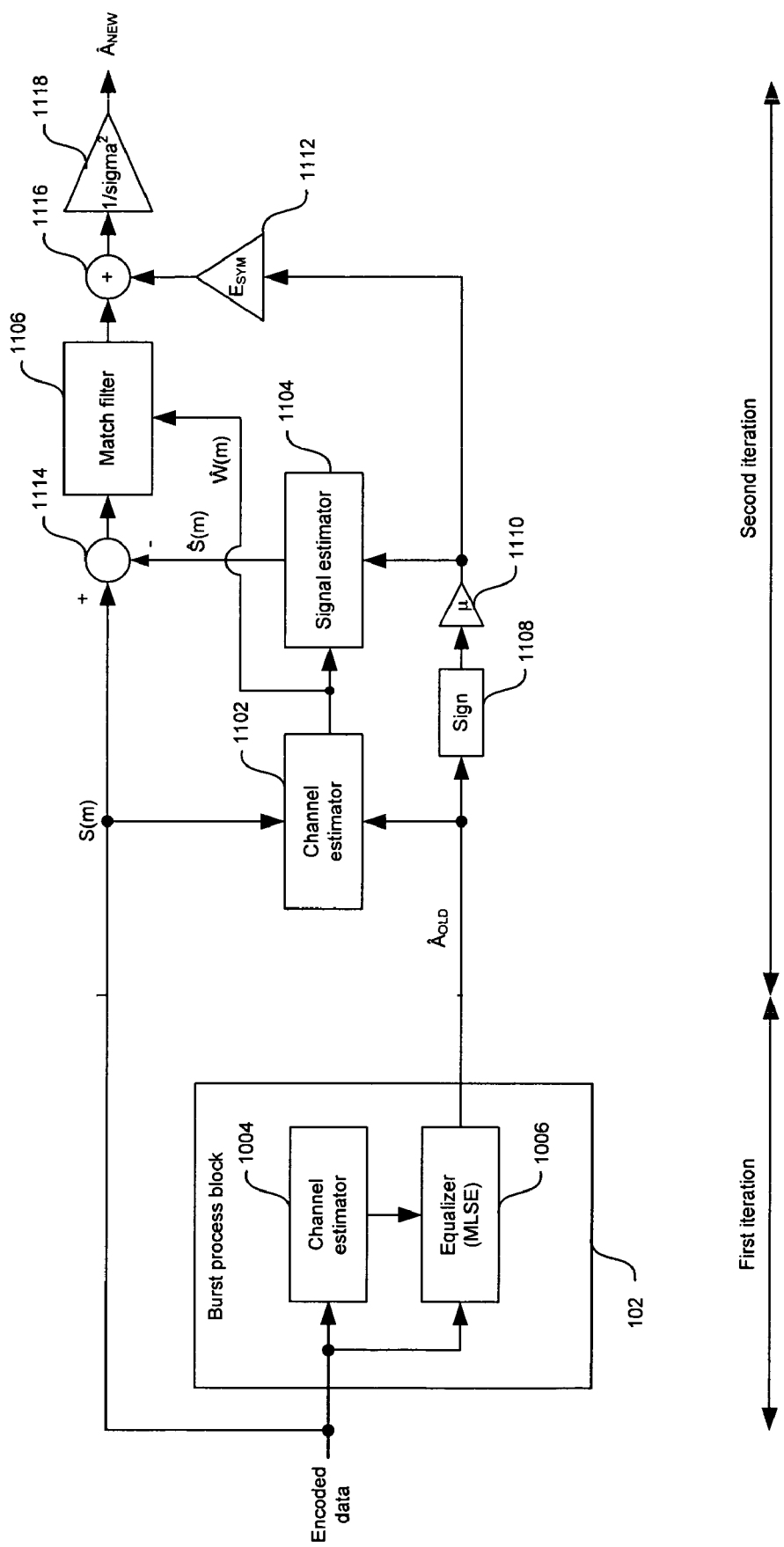
FIG. 11 is a block diagram illustrating exemplary implementation of a second burst process iteration based on a gradient search approach, in accordance with an embodiment of the invention.

FIG. 11 is a block diagram illustrating an exemplary implementation of a second burst process iteration based on a gradient search approach, in accordance with an embodiment of the invention. Referring to FIG. 11, the gradient search in the second iteration of the burst process may be implemented utilizing suitable logic, circuitry, and/or code and may comprise a channel estimator 1102, a signal estimator 1104, a match filter 1106, a sign converter 1108, a converger 1110, an energy estimator 1112, a first adder 1114, a second adder 1116, and a gain stage 1118.

The gradient search approach is based on finding the minimal distance H between a received and an estimated signal. The minimal distance H may be given by the expression:

$$H = \int (S(t) - \hat{S}(t))^2 dt,$$

where $$\hat{S}(t) = \sum_{k=0}^{K} \hat{A}_k \cdot \hat{W}(t - k \cdot T_{SYM}),$$

$\hat{A}_k$ is the $k^{th}$ element of the estimated symbols vector, and $\hat{W}(t)$ is the estimated symbol waveform. The gradient may be given by the expression:

$$G = \frac{\partial H}{\partial \hat{A}},$$

and $$G_k(\hat{A}) = \int \left( conj(\hat{W}(t - k \cdot T_{SYM})) \cdot \left( S(t) - \sum_{m=-\infty}^{+\infty} \hat{A}_m \cdot \hat{W}(t - m \cdot T_{SYM}) \right) \right) \cdot dt,$$

where $G_k$ is the $k^{th}$ element of gradient vector.

The signal estimator 1104 may comprise suitable logic, circuitry, and/or code that may be adapted to perform a signal estimation operation based on the following expression:

$$I(t) = SignalEstimation(\hat{A}) = \sum_{k=-\infty}^{+\infty} \hat{A}_k \cdot \hat{W}(t - k \cdot T_{SYM}).$$

The match filter 1106 may comprise suitable logic, circuitry, and/or code that may be adapted to perform a match filtering operation based on the following expression:

$G_k$=MatchFilter($S(t)−I(t)$)=∫($conj(\hat{W}(t−k \cdot T_{SYM})) \cdot (S(t)−I(t))) \cdot dt$.

The gradient expression may be written as:

$G_k(\hat{A})$=MatchFilter($S(t)$−SignalEstimation($\hat{A}$)).

Using the gradient expression, the value of $\hat{A}$ may be estimated by the following iteration equation:

$\hat{A}_{NEW} = \mu \cdot E_{SYM} \cdot \hat{A}_{OLD} + G_k(\mu \cdot \hat{A} old)$, where μ is a convergence coefficient that may be provided by the converger 1110 and that may be given by the expression $$\mu = \frac{1}{IterNum},$$

where $_{IterNum}$ may correspond to the number of iterations, and $E_{SYM} = \int |\hat{W}(t)|^2 \cdot dt,$ may correspond to the energy of the estimated channel $\hat{W}(t)$ provided by the energy estimator 1112. The gain stage 1118 may comprise suitable logic, circuitry, and/or code that may be adapted to generate a normalization of the output soft decision generated by the second adder 1116 to additive noise power (sigma^2). In some instances, the noise power may equal to the mean square error of estimation:

$$E_{NOISE} = sigma^2 = \frac{1}{T_{BURST}} \cdot \int_{T_{BURST}} (S(t) - \hat{S}(t))^2 dt.$$

The approach described herein may result in fewer decoding bit errors than may occur by a single iteration of the standard Viterbi algorithm. The use of an iterative multilayer process that utilizes redundancy and physical constraints may be efficiently implemented in the design of optimized receivers for decoding convolutional encoded data.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
generating an initial frame based on a received bit sequence;

generating a plurality of bit sequence hypotheses based on a portion of said initial frame;

generating a plurality of hypothesis decoded output bit sequences based on said plurality of bit sequence hypotheses;

generating an output frame based on said portion of said initial frame and one of said plurality of hypothesis decoded output bit sequences;

generating one or more hypothesis frames based on said portion of said initial frame and said plurality of hypothesis decoded output bit sequences; and selecting one or more candidate frames from among said one or more hypothesis frames based on a cyclical redundancy check (CRC) constraint.

2. The method according to claim 1, comprising generating said plurality of bit sequence hypotheses based on a maximum likelihood sequence estimation (MLSE) algorithm.

3. The method according to claim 1, comprising selecting said output frame from among said one or more candidate frames based on one or more physical constraints.

4. The method according to claim 3, wherein said one or more physical constraints are based on a source type and/or application.

5. The method according to claim 4, wherein said source type comprises voice, music and/or video.

6. The method according to claim 1, comprising generating said initial frame based on a Viterbi algorithm.

7. A system for signal processing, the system comprising:

one or more circuits that are operable to generate an initial frame based on a received bit sequence;

said one or more circuits are operable to generate a plurality of bit sequence hypotheses based on a portion of said initial frame;

said one or more circuits are operable to generate a plurality of hypothesis decoded output bit sequences based on said plurality of bit sequence hypotheses;

said one or more circuits are operable to generate an output frame based on said portion of said initial frame and one of said plurality of hypothesis decoded output bit sequences;

said one or more circuits are operable to generate one or more hypothesis frames based on said portion of said initial frame and said plurality of hypothesis decoded output bit sequences; and said one or more circuits are operable to select one or more candidate frames from among said one or more hypothesis frames based on a cyclical redundancy check (CRC) constraint.

8. The system according to claim 7, wherein said one or more circuits are operable to generate said plurality of bit sequence hypotheses based on a maximum likelihood sequence estimation (MLSE) algorithm.

9. The system according to claim 7, wherein said one or more circuits are operable to select said output frame from among said one or more candidate frames based on one or more physical constraints.

10. The system according to claim 9, wherein said one or more physical constraints are based on a source type and/or application.

11. The system according to claim 10, wherein said source type comprises voice, music and/or video.

12. The system according to claim 7, wherein said one or more circuits are operable to generate said initial frame based on a Viterbi algorithm.

\* \* \* \* \*